Dec. 1, 1970 MICHIHISA SUGA 3,544,914

SEMICONDUCTOR HIGH FREQUENCY AMPLIFIER DEVICE

Filed March 11, 1969

INVENTOR.
MICHIHISA SUGA

BY

Sandoe, Hopgood & Calimafde
ATTORNEYS

United States Patent Office 3,544,914

Patented Dec. 1, 1970

3,544,914
SEMICONDUCTOR HIGH FREQUENCY AMPLIFIER DEVICE

Michihisa Suga, Tokyo, Japan, assignor to Nippon Electric Company, Limited, Tokyo, Japan, a company of Japan Filed Mar. 11, 1969, Ser. No. 806,196
Claims priority, application Japan, Mar. 12, 1968, 43/16,306
Int. Cl. H03f 3/04
U.S. Cl. 330—5 6 Claims

ABSTRACT OF THE DISCLOSURE

A semiconductor high frequency amplifier device is described. The device utilizes a semiconductor body made of a material having a bulk negative resistance effect of a filed-control type. The body is provided with a metallic layer between cathode and anode electrodes to control the electric field distribution whereby substantially all of the region, except for a small portion adjacent the cathode, may support an electric field intensity above a threshold level needed to sustain a high field domain.

This invention relates to a high frequency amplifier device utilizing a bulk negative resistance effect of a semiconductor crystal. More particularly, this invention relates to a semiconductor high frequency amplifier of the kind having an improved amplifying efficiency and noise figure.

A semiconductor crystal, such as an n-type GaAs crystal, has an electric-field-control type bulk negative resistance which, when the electric field intensity increases to a certain threshold value tends to reduce the drift velocity of the carriers that affect the conductivity of the crystal. When the value of the product of the impurity concentration, which contributes to the generation of the carriers, and the distance between a pair of D.C. field bias-applying ohmic electrodes is greater than a certain definite critical value (for example, $10^{12}$ cm.$^{-2}$ in the case of n-type GaAs), a current oscillation well known in the Gunn effect phenomenon takes place in the crystal in response to a high D.C. field produced by a bias applied across the electrodes. When the value of the product of the impurity concentration and the electrode spacing is smaller than the critical value, the device will not oscillate. Also, below this critical product value, a stable electric field intensity distribution is observed which is smallest at the cathode and increases towards the anode. Below the critical produce value, it is possible for a space-charge wave to grow within the crystal provided the value of the field intensity in the element is greater than a threshold value (above 3000 v.·cm.$^{-1}$ in n-type GaAs). As a result a negative conductance within an appropriate frequency range appears (see for instance Uenohara, "Inner Effect of GaAs and Its Applications," Journal of the Institute of Electrical Engineers of Japan, vol. 86–11, No. 938, p. 49 (1966)).

Commonly, a pair of auxiliary electrodes are attached in the vicinity of the anode and cathode for coupling to external circuits such as a delay circuit and others. With the application of an input signal from an external high frequency signal source across the cathode and the auxiliary electrode located near the cathode, a space-charge wave propagating from the cathode to the anode is generated. This wave is intensified while propagating through a negative resistance region adjacent the cathode toward the anode. The amplified output is picked up from an auxiliary electrode disposed near the anode. Such bulk semiconductor high frequency amplifier device is well known (see for instance P. N. Robson, G. S. Kino, and B. Fay, "Two-Part Microwave Amplification in Long Samples of GaAs," IEEE Transaction of Electron Devices, vol. ED–14, No. 9, p. 62 (September 1967)). In such conventional device, however, the electric field distribution shows a positive resistance in a transitional region between the cathode and the negative resistance region. This transitional region acts to weaken the coupling between the input circuit and the semiconductor crystal, and lowers the amplifying efficiency of the device. Furthermore, the transition region becomes a noise source and increases the noise figure of the device. In order to avoid lowering the amplification factor, it is necessary that the input electrode in the vicinity of the cathode be disposed in the portion near the cathode in the negative resistance region. However, the crystalline part between the input auxiliary electrode and the cathode also causes power loss and introduces noise.

The object of this invention is, therefore, to provide a semiconductor high frequency amplifier device of the high field travelling wave type, with an excellent amplifying efficiency and low noise figure, utilizing a bulk negative resistance characteristic of a field-control type of a semiconductor crystal.

The above-mentioned and other features and objects of this invention and the manner of attaining them will become more apparent and the invention itself will best be understood by reference to the following description of an embodiment of the invention taken in conjunction with the accompanying drawings, the description of which follows.

The high frequency amplifier device according to this invention is a semiconductor element comprising a piece of semiconductor crystal which possesses a negative resistance characteristic of the field controlled type, two ohmic electrodes attached to both ends of the piece, a metallic layer formed on the side surface of the crystal, an auxiliary electrode disposed near one of the ohmic electrodes for applying a high frequency input signal, and another auxiliary electrode disposed in the vicinity of the other ohmic electrode for receiving and detecting the amplified high frequency signal.

When a high D.C. filed is applied via two ohmic electrodes to a semiconductor element having the mentioned structure, the conventional device exhibits an electric field distribution in the element which uniformly increases toward the anode from the cathode and thus includes a relatively long transition region where the electric field intensity is below a threshold level necessary to sustain a travelling high field domain.

In the semiconductor device of this invention, the length of the region wherein the field intensity increases from zero to the threshold level where Gunn oscillation may be produced is significantly reduced. This reduction is accomplished by use of a metallic layer bonded to a side surface of the crystal by way of a dielectric material. Accordingly, an amplifier element whose amplifying efficiency and noise figure are improved can be obtained. Furthermore, the above-mentioned advantage relating to the field distribution can be obtained even when the product of the impurities concentration and the electrode spacing exceeds the critical value (for example, $10^{12}$ cm.$^{-2}$ in n-type GaAs), so that an amplifier element having a high amplification constant can be obtained by extending the cathode-anode and input-output electrode spacings.

Now, the invention will be explained in detail in conjunction with the accompanying drawings.

Figure 1:
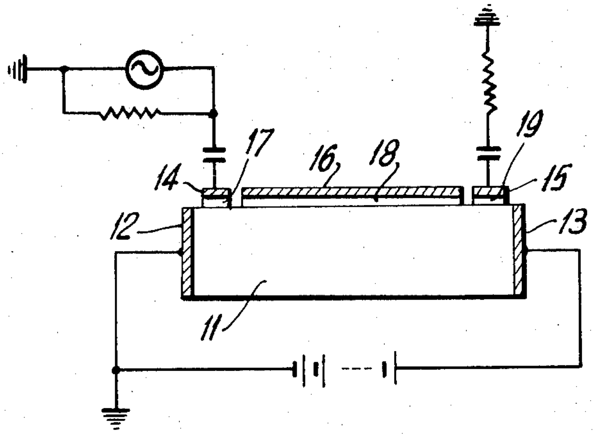
FIG. 1 is a longitudinal sectional view of an embodiment of this invention.

Referring to FIG. 1, an embodiment of this invention comprises an n-type GaAs single crystal 11, an ohmic cathode electrode 12, an ohmic anode electrode 13, a capacitive coupled input electrode 14 and a capacitive coupled output electrode 15 formed by evaporation on thin dielectric insulating layers 17 and 19 respectively. A metallic plate 16 is deposited by evaporation on a thin dielectric insulating layer 18. It is desirable for the input electrode 14 and the output electrode 15 to be formed near the cathode 12 and the anode 13, respectively. Further, in order to be effective on the semiconductor crystal 11, the metallic plate 16 should be large enough compared with the cross-section of the crystal perpendicular to the direction of current flow.

In the embodiment shown in FIG. 1, application of a D.C. high electric field to the semiconductor through the two electrodes 12 and 13 causes a high field domain to be formed and to propagate through the crystal piece from the vicinity of cathode 12 to anode 13. This causes a Gunn effect oscillation. On the other hand, a charge distribution corresponding to the potential distribution in the n-type GaAs single crystal 11 appears in the metallic plate 16 and, accordingly, the charge distribution in the metallic plate 16 varies in correspondence with the growth and drift of the high field domain. Thus, a current appears in the metallic plate 16. This current is especially great in that part of the metallic plate 16 located in the vicinity of the n-type GaAs single crystal 11 where the timewise variation in the potential distribution is especially great.

When the dielectric layer 18 is sufficiently thin, the effect is as if both sides of the high field domain were short-circuited. As a result, the growth of the high field domain is prevented and periodic transit of the high field domain essential for sustained Gunn oscillation does not take place.

Figure 2:
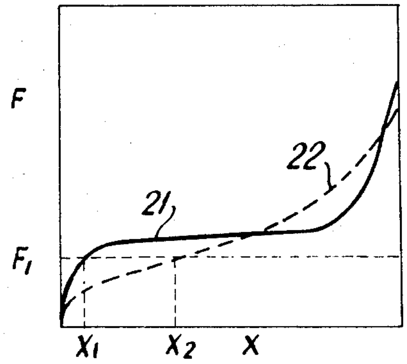
FIG. 2 is a diagram showing the electric field intensity distribution in the embodiment in comparison with that of a conventional device.

Accordingly, the electric field intensity along the n-type GaAs single crystal 11 has a constant distribution 21, as illustrated in FIG. 2 wherein the abscissa indicates the distance X from the cathode and the ordinate indicates the electric field intensity F. Comparing this field distribution 21 with the field distribution 22 in a conventional semi-conductor device of the similar type in which the product of the effective donor density in the crystal and the distance between the electrodes is smaller than $10^{12}$ cm.$^{-2}$, the undesirable transitional region between the cathode and the negative resistance region decreases from $X_2$ to $X_1$, in the device of FIG. 1, whereby the negative resistance region in which the field intensity exceeds the threshold value $F_t$ is correspondingly increased. By virtue of this feature, power loss in the transitional region is decreased and the generation of noise also decreased, compared with those of the conventional semiconductor amplifier devices of the similar kind. As a result, improved amplification efficiency and noise figure are made available with the semiconductor amplifier device of this invention as shown in FIG. 1.

The object of this invention can be achieved even when the capacitive input electrode 14 and output electrode 15 are replaced with an electrode combined with a relay circuit, an ohmic electrode, or a rectifier electrode.

While the principles of the invention have been described in connection with the specific apparatus, it is to be clearly understood that this description is made only by way of example and not as a limitation to the scope of the invention as set forth in the objects thereof and in the accompanying claims.

I claim:

1. A semiconductor high frequency amplifier device comprising a semiconductor body made of a material having a bulk negative resistance effect of a field-control type, an anode electrode and a cathode electrode coupled respectively to both ends of said semiconductor body, a conductive layer capacitively coupled to the semiconductor body betwen the anode and cathode electrodes, said metallic layer being electrically isolated from said anode and cathode electrodes and being selectively dimensioned with respect to the cross-sectional area of said body size to effectively establish a uniformly distributed electric field within the body between the anode and cathode, means for applying input signals to the semiconductor body, and means for deriving output signals from the semiconductor body.

2. The device as recited in claim 1 wherein the semiconductive body is provided with a thin dielectric layer underneath the conductive layer.

3. The device as recited in claim 2 wherein said means applying input signals and said means for deriving output signals include metallic electrodes located in the vicinity of said cathode and anode electrodes and capacitively coupled to said semiconductor body.

4. A semiconductor high frequency amplifier comprising:

a semiconductor body made of a material having a bulk negative resistance effect of the field-control type;

an anode and a cathode electrode coupled respectively to both ends of said semiconductor body;

a dielectric layer formed on the surface of said semiconductor body extending between said anode and cathode electrodes;

a conductive layer attached to the surface of said dielectric layer, said conductive layer being large enough compared with the cross-section of said semiconductor body perpendicular to the direction between said anode and cathode electrodes so as to effectively establish a uniformly distributed electric field and to decrease a transition region within said semiconductor body;

means for applying input signals to the semiconductor body, and means for deriving output signals from said semiconductor body.

5. The device as recited in claim 4, wherein said means for applying input signals and said means for deriving output signals include metallic electrodes respectively located in the vicinity of said cathode and anode electrodes, and comprising second and third dielectric layers respectively interposed between said metallic electrodes and said body for capacitively coupling said metallic electrodes to said body.

6. The device as recited in claim 4, in which said conductive layer is electrically isolated from said anode and cathode electrodes.

References Cited

UNITED STATES PATENTS

| | | | |
|---|---|---|---|
| 3,350,656 | 10/1967 | Vural | 330—5 |
| 3,439,236 | 4/1969 | Bucher | 317—235 |
| 3,464,020 | 8/1969 | Koyama et al. | 330—5 |

OTHER REFERENCES

"High-Octane GaAs," Electronics, Dec. 11, 1967, p. 255.

ROY LAKE, Primary Examiner

J. B. MULLINS, Assistant Examiner

U.S. Cl. X.R.

330—35, 39; 331—107